United States Patent
Inoue et al.

(10) Patent No.: US 6,813,169 B2
(45) Date of Patent: Nov. 2, 2004

(54) INVERTER DEVICE CAPABLE OF REDUCING THROUGH CURRENT

(75) Inventors: Hiroyuki Inoue, Tokyo (JP); Akira Ohmichi, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/603,626

(22) Filed: Jun. 26, 2003

(65) Prior Publication Data

US 2004/0145918 A1 Jul. 29, 2004

(30) Foreign Application Priority Data

Jan. 24, 2003 (JP) ........................................ 2003-016306

(51) Int. Cl.$^7$ ............................................. H02H 7/122
(52) U.S. Cl. .................................................. 363/56.04
(58) Field of Search ........................... 363/56.04, 56.03, 363/56.02, 132, 98

(56) References Cited

U.S. PATENT DOCUMENTS 4,989,127 A * 1/1991 Wegener ...................... 363/16

FOREIGN PATENT DOCUMENTS

| JP | 61-147780 | 5/1986 |
| JP | 01-214269 | 8/1989 |
| JP | 7-194138 | 7/1995 |
| JP | 2001-136751 | 5/2001 |

OTHER PUBLICATIONS

K. Makabe, "Control Circuit Design for Stepping Motor", CQ Publishing Co., Ltd., May 1987, pp. 33–119.

* cited by examiner

Primary Examiner—Shawn Riley
(74) Attorney, Agent, or Firm—Leydig, Voit & Mayer, Ltd.

(57) ABSTRACT

A first transistor is turned on when an H-level signal is input. A power supply voltage is applied to a gate electrode of a first switching element to charge a miller capacitance of the first switching element. As a result, gate voltage of the first switching element rises gradually and the first switching element is turned on. In this manner, the first switching element is controlled so that switching speed of the first switching element decreases. During this time, a through current caused by a backward recovery current of a flywheel diode connected to the first switching element is reduced. When the gate voltage of the first switching element exceeds a logic inversion voltage, the first switching element is controlled so that the switching speed is increased.

10 Claims, 4 Drawing Sheets

INVERTER DEVICE CAPABLE OF REDUCING THROUGH CURRENT

BACKGROUND OF THE INVENTION

1) Field of the Invention

The present invention relates to an inverter device capable of reducing through current generated when two series connected switching elements that are on/off controlled.

2) Description of the Related Art

An inverter device is used as, for example, a driving device for a three-phase motor. The inverter device used as the three-phase motor driving device includes an output circuit. This output circuit includes pairs of switching elements to which fly-wheel diodes are connected, respectively, in series between the positive electrode terminal and the negative electrode terminal (ground terminal) of a direct-current (DC) power supply and the pairs of switching elements are connected in parallel for the three phases. An output to a motor is fetched from the connection end between each pair of switching elements connected in series (see, for example, Kuniaki Makabe, Control Circuit Design for Stepping Motor, (CQ Publishing Co., Ltd., pp. 35 to 118)).

The output circuit of the inverter device is controlled according to pulse width modulation (PWM) method. Namely, the output circuit is controlled so that each of pairs of switching elements connected in series are alternately turned on and off, the ON/OFF operation time ratio of the pair is changed to thereby change the magnitudes of the output voltages thereof, and that the combinations of the pairs turned on and off are changed to change the polarities of the output voltages.

Each pair of switching elements connected in series is controlled to be alternately turned on and off with OFF operation periods given to the operations of the pair so that the ON operation states of the pair do not occur concurrently. During this time, a motor driving current in each phase is carried without intermission. That is, if the operation of one of the switching elements of, for example, an upper arm is switched from an ON operation state to an OFF operation state, the corresponding one of the switching elements of a lower arm is in an OFF operation state.

However, a regenerative current generated by the energy accumulated by the inductance of the motor flows, while being attenuated, in the same direction as the motor driving current is carried to the fly-wheel diode connected to the switching element of the upper arm. The switching element of the lower arm is then turned on, and the motor driving current in the same direction is carried to the switching element of the lower arm. The fly-wheel diode of the upper arm is applied with a backward voltage and turned off.

The conventional technology has the following disadvantages. During the operation process, when the fly-wheel diode of the upper arm is turned off in response to the ON operation of the switching element of the lower arm, a backward current (backward recovery current) is carried to the fly-wheel diode of the upper arm for the time that is specified by backward recovery characteristic of the diode. For that reason, a short-circuit between the positive electrode terminal and the negative electrode terminal of the DC power supply occurs, though momentarily, in which, a through current flows. This backward recovery current carried to the fly-wheel diode of the upper arm becomes excessive if the switching speed of the switching element of the lower arm is high, thereby disadvantageously making circuit operation unstable.

SUMMARY OF THE INVENTION

It is an object of the present invention to solve at least the problems in the conventional technology.

The inverter device according to one aspect of the present invention comprises a direct-current power supply having a positive electrode terminal and a negative electrode terminal; a first set of switching elements including a plurality of switching elements connected in parallel; a second set of switching elements including a plurality of switching elements connected in parallel, wherein each of the switching elements of the first set being connected in series with a corresponding one of the switching elements of the second set to form a pair of switching elements including a first switching element and a second switching element, between the positive electrode terminal and the negative electrode terminal of the direct-current power supply; a plurality of fly-wheel diodes, each of the fly-wheel diodes being connected to each of the first switching element and the second switching element, wherein the first switching element and the second switching element being turned on and off alternately while changing a time ratio and a signal output at a node between the first switching element and the second switching element being supplied to an inductance load; a first transistor that receives a control signal for turning on the first switching element, applies a power supply voltage to a control electrode of first switching element, and starts charging a miller capacitance of the first switching element; a detection circuit that detects a timing at which a voltage of the control electrode of the first switching element reaches a logic inversion voltage while the control signal for turning on the first switching element, and outputs a detection signal indicating the timing; and a second transistor that receives the detection signal, applies the power supply voltage to the control electrode of the first switching element, and accelerates charging the miller capacitance.

The inverter device according to another aspect of the present invention includes a direct-current power supply having a positive electrode terminal and a negative electrode terminal; a first set of switching elements including a plurality of switching elements connected in parallel; a second set of switching elements including a plurality of switching elements connected in parallel, wherein each of the switching elements of the first set being connected in series with a corresponding one of the switching elements of the second set to form a pair of switching elements including a first switching element and a second switching element, between the positive electrode terminal and the negative electrode terminal of the direct-current power supply; a plurality of fly-wheel diodes, each of the fly-wheel diodes being connected to each of the first switching element and the second switching element, wherein the first switching element and the second switching element being turned on and off alternately while changing a time ratio and a signal output at a node between the first switching element and the second switching element being supplied to an inductance load; a first transistor that receives a control signal for turning on the first switching element, applies a power supply voltage to a control electrode of first switching element, and starts charging a miller capacitance of the first switching element; a detection circuit that detects a timing at which a potential difference between both signal electrodes of the first switching element reaches a logic inversion voltage while the control signal for turning on the first switching element, and outputs a detection signal indicating the timing; and a second transistor that receives the detection signal, applies the power supply voltage to the control electrode of the first switching element, and accelerates charging the miller capacitance.

The other objects, features and advantages of the present invention are specifically set forth in or will become apparent from the following detailed descriptions of the invention when read in conjunction with the accompanying drawings.

DETAILED DESCRIPTION

Exemplary embodiments of an inverter device according to the present invention are explained in detail below with reference to the accompanying drawings.

Figure 1:
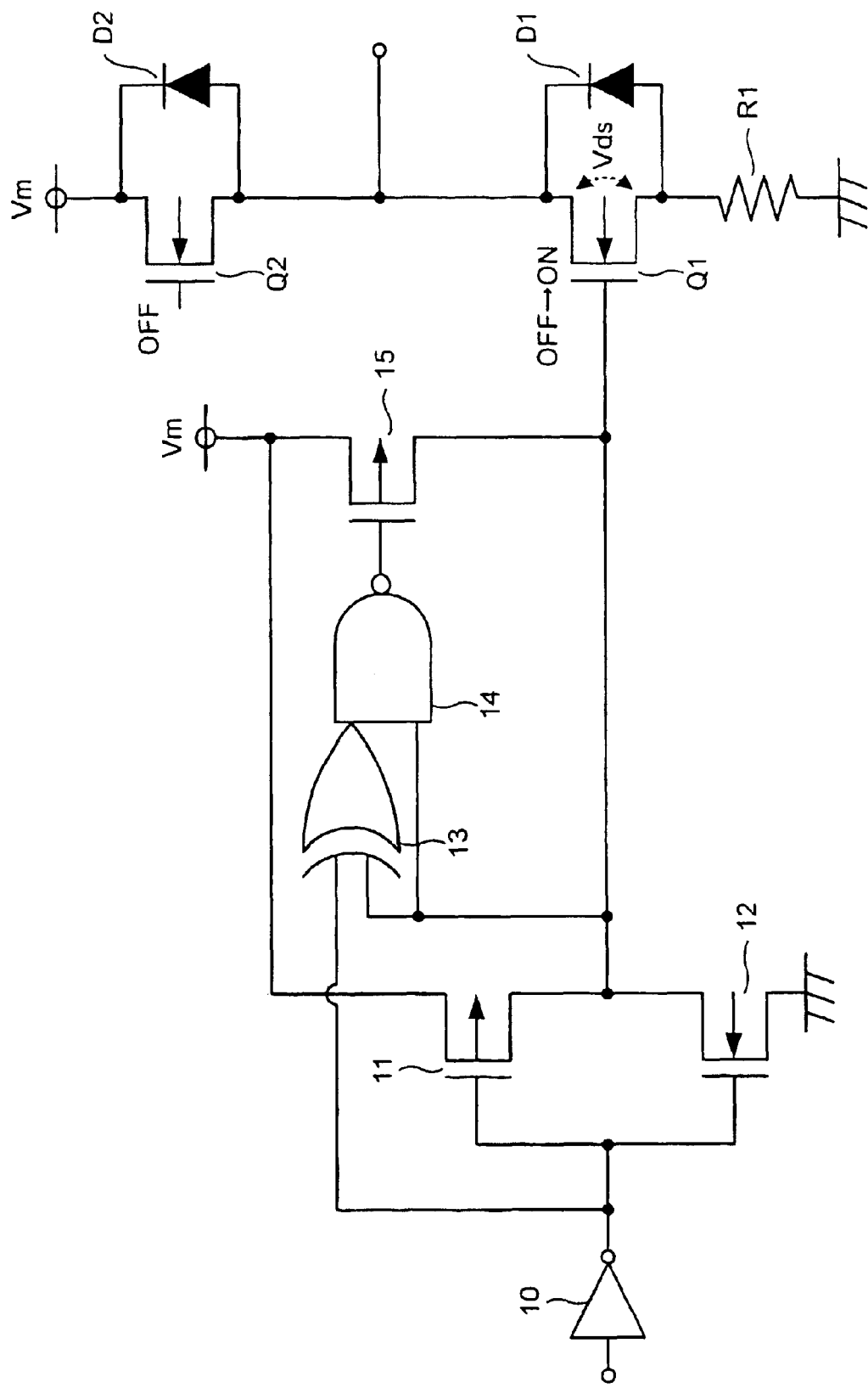
FIG. 1 is a circuit diagram of an output circuit in an inverter device according to a first embodiment of the present invention.
Figure 3:
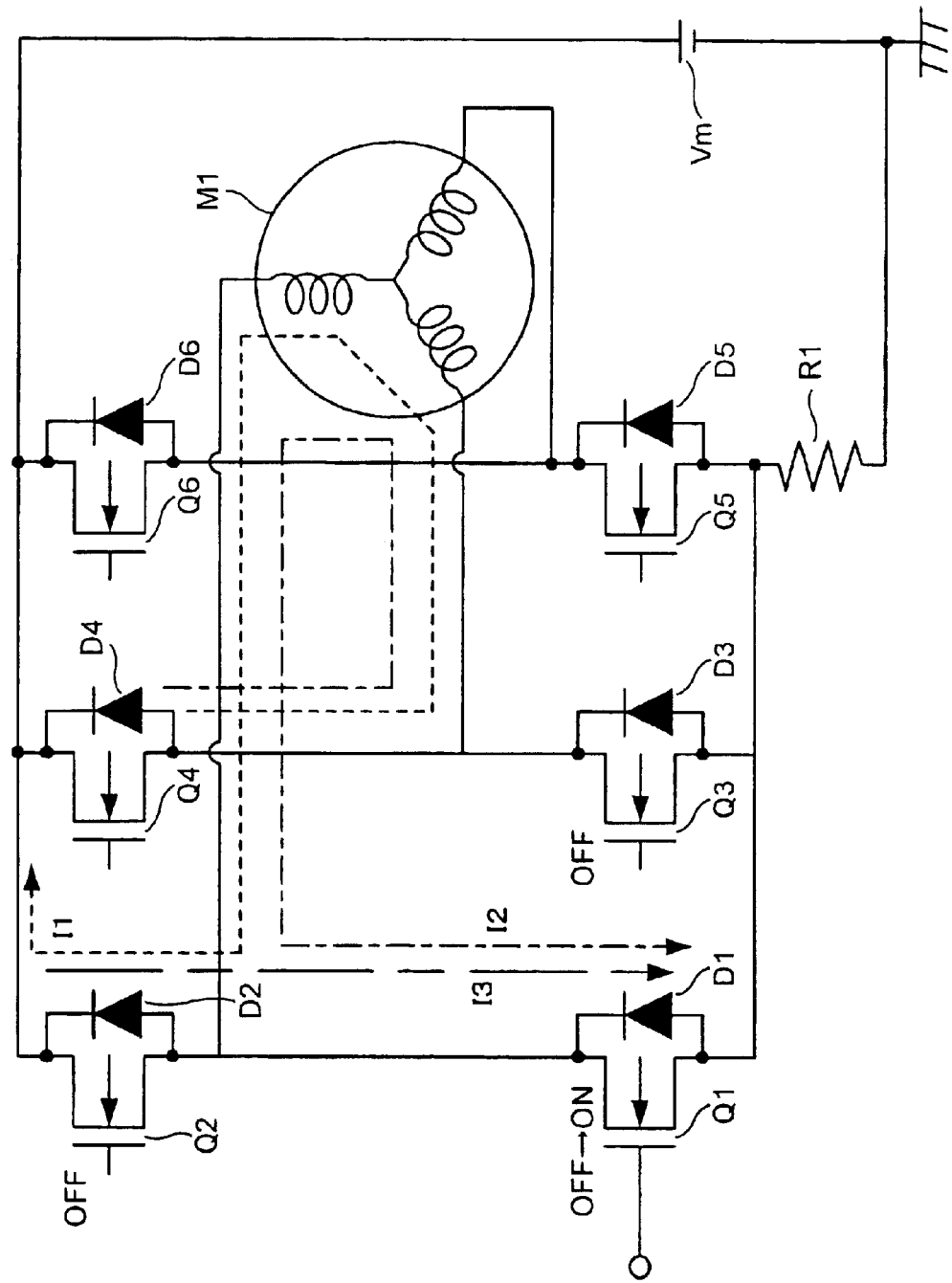
FIG. 3 is a circuit diagram of the output circuit in the inverter device to which the present invention is directed.
Figure 4:
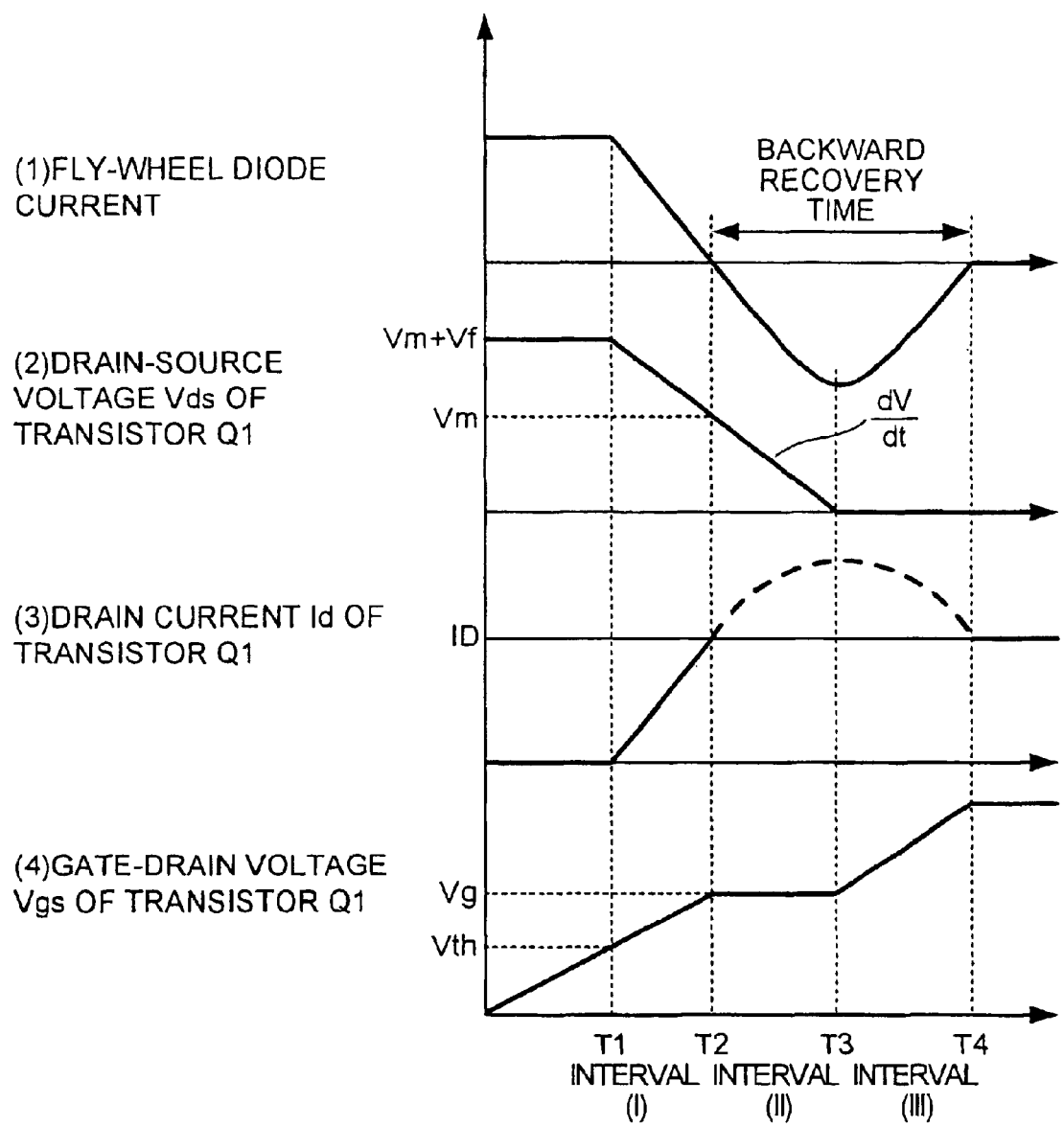
FIG. 4 is a characteristic view that explains the relationship between the backward recovery characteristics of a fly-wheel diode and the operation of a switching element in the output circuit shown in FIG. 3.

FIG. 1 is a circuit diagram of an output circuit in an inverter device according to a first embodiment of the present invention. To facilitate the understanding of the present invention, the output operation of the inverter device will first be explained with reference to FIGS. 3 and 4. FIG. 3 is a circuit diagram of a known output circuit of the inverter device. FIG. 4 is a characteristic view that explains the relationship between the backward recovery characteristics of a fly-wheel diode and the operation of a switching element in the output circuit shown in FIG. 3.

The output circuit shown in FIG. 3 is assumed to be employed as a driving circuit for a three-phase motor in the inverter device. The output circuit includes six negative metal-oxide semiconductor (NMOS) field-effect transistors Q1 to Q6 as switching elements Source electrodes of NMOS field-effect transistors Q2, Q4, and Q6 are connected to the positive electrode terminal of a DC power supply Vm. Source electrodes of NMOS transistors Q1, Q3, and Q5 are connected to the negative electrode terminal (ground terminal) of the DC power supply Vm through an external resistor R1.

Drain electrodes of the NMOS transistors Q1 and Q2, Q3 and Q4, and Q5 and Q6 are connected in common. The nodes of Q1 and Q2, Q3 and Q4, and Q5 and Q6 are connected to corresponding phase input terminals of a three-phase motor M1.

Fly-wheel diodes D1 to D6 are connected between the drains and sources of the transistors Q1 to Q6, respectively. If. double-diffused MOS or DMOS transistors are employed as the NMOS transistors Q1 to Q6, the fly-wheel diodes D1 to D6 are built-in diodes that are created when forming the NMOS transistors Q1 to Q6, respectively.

The output circuit thus constituted is controlled according to the PWM method. Namely, the output circuit is controlled in such a manner that each of pairs of NMOS transistors (Q1, Q2), (Q3, Q4), and (Q5, Q6) are alternately turned on and off, period of which each of the pairs of NMOS transistors are turned ON/OFF is changed to thereby change the magnitude of the output voltages thereof, and that combinations of the NMOS transistors to be turned on and off are changed to thereby change the polarities of the output voltages of the switching elements.

Each of the pairs of NMOS transistors (Q1, Q2), (Q3, Q4), and (Q5, Q6) are controlled to be alternately turned on and off with OFF operation periods given to the operations of the pair so that the ON operation states of the pair do not occur concurrently. During this time, the motor driving current in each phase is carried without intermission. One phase of the three-phase motor M1 will be explained.

For example, if the NMOS transistors Q1 and Q4 are turned OFF and NMOS transistors Q2 and Q3 are turned ON, then the motor driving current flows in the direction of NMOS transistor Q2 to the three-phase motor M1 and finally to the NMOS transistor Q3.

If the NMOS transistor Q2 is turned OFF, the NMOS transistor Q4 is turned ON, and the NMOS transistor Q3 is turned OFF, then a regenerative current I1 generated by the energy accumulated by the inductance of the three-phase motor M1 flows while being attenuated in the direction of NMOS transistor Q4 to the three-phase motor M1 and to the fly-wheel diode D2. This direction is the same as that of the motor driving current.

If the NMOS transistor Q1 is turned ON, a motor driving current I2 in the same direction flows in the direction of NMOS transistor Q4 to three-phase motor M1 to NMOS transistor Q1. At this time, the fly-wheel diode D2 is applied with a backward voltage and turned off.

During the operation process, when the fly-wheel diode D2 of the upper arm is turned off in response to the ON operation of the NMOS transistor Q1 of the lower arm, a backward current (backward recovery current) is carried to the fly-wheel diode D2 of the upper arm for the time specified by the backward recovery characteristics of the diode D2 (see FIG. 4). For that reason, a state of the short-circuit between the positive electrode terminal and the negative electrode terminal of the DC power supply Vm occurs, though momentarily, through the serial circuit consisting of the fly-wheel diode D2 and the NMOS transistor Q1, in which state, a through-type current I3 flows. This backward recovery current carried to the fly-wheel diode D2 of the upper arm becomes considerably excessive if the switching speed of the NMOS transistor Q1 of the lower arm is high.

The operations of the fly-wheel diode D2 and the NMOS transistor Q1 when the through-type current I3 occurs will be explained with reference to FIG. 4. In FIG. 4, the forward current (regenerative current I1) IF of the fly-wheel diode D2 as indicated by (1) is constant before time T1. At the time T1, when a backward voltage Vf is applied thereto, the current IF decreases toward zero. At time T2, the current IF becomes zero. Because of the backward voltage Vf, during the period between the time T2 and the time T4 which is backward recovery time, a backward recovery current flows. This backward recovery current reaches a maximum at intermediate time T3.

Referring to (2) to (4) in FIG. 4, since the backward voltage Vf is applied to the drain electrode of the NMOS transistor Q1, the drain-source voltage Vds thereof is/Vm+Vf before the time T1 (FIG. 4, (2)). As an ON operation signal is applied to the gate electrode of the NMOS transistor Q1, the charging of a miller capacitance (gate capacitance) Cgd starts. At the time T1, the gate-drain voltage Vgs of the transistor Q1 reaches a threshold voltage Vth (FIG. 4, (4)).

As a result, the drain-source voltage Vds falls from Vm+Vf with a gradient of dV/dt, and reaches the power supply voltage Vm at the time T2 (FIG. 4, (2)). In addition, the drain current Id flows out of the transistor Q1 at the time T1, and reaches a predetermined value at the time T2 (FIG. 4, (3)). The gate-drain voltage Vgs rises from the threshold voltage Vth in accordance with Vds/Id characteristics, and reaches the gate voltage Vg specified by the Vds/Id characteristics at the time T2 (FIG. 4, (4)).

Thereafter, the drain-source voltage Vds falls from the power supply voltage Vm with the gradient of dV/dt, becomes 0V at the time T3 when the backward recovery current hits a peak, and keeps 0V thereafter (FIG. 4, (2)). The charging of the miller capacitance (gate capacitance) Cgd ends at the time T3. During a period from the time T2 to the time T4 when the backward recovery time ends, the drain current Id that exceeds the predetermined value flows and keeps to be the predetermined value after the time T4 (FIG. 4, (3)).

As can be understood from FIG. 4, the backward recovery characteristics and backward recovery time of the fly-wheel diode D2 are determined by an interval (I) from the time T1 when the gate-drain voltage Vgs reaches the threshold voltage Vth to the time T2 when the voltage Vgs rises to the gate voltage Vg, and an interval (II) from the time T2 to the time T3.

Therefore, to lower the level of the through-type current, it suffices to lengthen the interval (I) between the time T1 and the time T2 and the interval (II) between the time T2 and the time T3. In other words, it suffices to decrease the switching speed of the NMOS transistor Q1. However, if the switching speed of the NMOS transistor Q1 is simply decreased, an interval (III) between the time T3 and the time T4 lengthens, and in that case desired circuit characteristics cannot be obtained.

In the example of the configuration shown in FIG. 3, the NMOS transistors Q1 to Q6 are assumed to have high switching speeds. The present invention is characterized by including a switching speed change-over circuit that decreases the switching speeds of the NMOS transistors Q1, Q3, and Q5 of the lower arm at the time T1 to the time T3 and that increases them at the time T3 to the time T4 is provided according to the present invention. As a result of the provision of this switching speed change-over circuit, desired circuit characteristics are obtained while lowering the level of the through-type current. Two embodiments of the switching speed change-over circuit of the present invention are explained below with reference to FIGS. 1 and FIG. 2, respectively.

With reference to FIG. 3, the output circuit of the inverter device in the first embodiment is constituted in such a manner that the switching speed of the NMOS transistors is increased step by step in accordance with the rise of the gate voltages of the NMOS transistors Q1, Q3, and Q5. In FIG. 1, the switching speed change-over circuit for the NMOS transistor Q1 is particularly shown, and the rest of the configuration of the output circuit is the same as the one shown in FIG. 3.

In the output circuit shown in FIG. 1, an inverter circuit 10 is a complementary metal-oxide semiconductor (CMOS) inverter circuit. An ON/OFF control signal for switching the NMOS transistor Q1 from the outside of the device is applied to the input terminal (anode) of the inverter circuit 10. The gate electrodes of a positive metal-oxide semiconductor (PMOS) transistor 11 and an NM OS transistor 12 that constitute a CMOS inverter circuit, and one of the input terminals of an EXCLUSIVE-OR circuit 13 are connected to the output terminal of the inverter circuit 10.

The source electrode of the PMOS transistor 11 is connected to the power supply Vm, and that of the NMOS transistor 12 is connected to the ground. The drain electrode of the PMOS transistor 11 and that of the NMOS transistor 12 are connected in common to the gate electrode of the NMOS transistor Q1, the other input terminal of the EXCLUSIVE-OR circuit 13, and one of the input terminals of a NAND circuit 14.

The output terminal of the EXCLUSIVE-OR circuit 13 is connected to the other input terminal of the NAND circuit 14. The output terminal of terminal of the NAND circuit 14 is connected to the gate electrode of a PMOS transistor 15. The source electrode of the PMOS transistor 15 is connected to the power supply Vm, and the drain electrode thereof is connected to the gate electrode of the NMOS transistor Q1.

It is noted that the PMOS transistor 11 corresponds to a first transistor, the EXCLUSIVE-OR circuit 13 and the NAND circuit 14 correspond to a detection circuit as a whole, and the PMOS transistor 15 corresponds to a second transistor.

The output circuit shown in FIG. 1 operates as follows. If a signal at a low logical level (hereinafter, "L level signal") is applied to the inverter circuit 10, the PMOS transistor 11 is turned off and the NMOS transistor 12 is turned on. As a result, the gate electrode of the NMOS transistor Q1 gets connected to the ground through the NMOS transistor 12, and the NMOS transistor Q1 is turned off.

If a signal at high logical level (hereinafter, "H level signal") is then applied to the inverter circuit 10, the PMOS transistor 11 is turned on and the NMOS transistor 12 is turned off. As a result, the gate electrode of the NMOS transistor Q1 gets connected to the power supply Vm through the PMOS transistor 11, and the charging of the miller capacitance Cgd starts.

Charging time for the miller capacitance Cgd relies on the ON resistance of the PMOS transistor 11. If the ON resistance is high, the charging time is long and the switching speed of the NMOS transistor Q1 is decreased. That is, the gate voltage of the NMOS transistor Q1 gradually rises according to a charge progress status, and reaches the threshold voltage Vth at which the NMOS transistor Q1 is turned on. In the example of FIG. 4, (4), this means that the time required before the time T1 is lengthened. During this time, the NMOS transistor Q1 gradually moves to a conductive state. In the initial period in which the NMOS transistor Q1 moves to this conductive state, the through-type current caused by the backward recovery current of the fly-wheel diode D2 of the upper arm is carried to the transistor Q1. However, the level of the through-type current is lowered.

Even if the gate voltage of the NMOS transistor Q1 exceeds the threshold voltage Vth, the output of the EXCLUSIVE-OR circuit 13 is kept at L level and that of the NAND circuit 14 is kept at H level until the gate voltage of the transistor Q1 reaches the logic inversion voltage of the EXCLUSIVE-OR circuit 13. Therefore, the PMOS transistor 15 is kept to be turned off. Accordingly, the operation for lowering the level of the through-type current is continued.

If the gate voltage of the NMOS transistor Q1 exceeds the threshold voltage Vth and reaches the logic inversion voltage of the EXCLUSIVE-OR circuit 13, then the output of the inverter 10 is at L level and that of the drain electrode of the PMOS transistor 11 is at H level. Therefore, the output of the EXCLUSIVE-OR circuit 13 is set at H level. As a result, the output of the NAND circuit 14 is set at L level, the PMOS transistor 15 is turned on, and the gate electrode of the NMOS transistor Q1 is connected to the power supply Vm.

Consequently, the charging of the miller capacitance Cgd is carried out from both the PMOS transistors 11 and 15 and accelerated, accordingly, the switching speed of the NMOS transistor Q1 is increased. Thereafter, the NMOS transistor Q1 is kept to be turned on so that the drain-source voltage Vds becomes 0V by the time the H-level signal applied to the inverter circuit 10 falls to L level. In the example of FIG. 4, (4), this corresponds to an instance in which the interval (II) is extremely short and the interval (III) is eliminated.

The switching speed of the NMOS transistor Q1 can be freely changed by setting the ON resistances of the PMOS transistors 11 and 15 according to purpose in light of the miller capacitance Cgd.

As explained above, according to the output circuit of the first embodiment, if the NMOS transistor of the lower arm is driven to be turned on, the switching speed of the NMOS transistor can be controlled to be low while the gate voltage thereof reaches the threshold voltage, and to be high when the gate voltage exceeds the threshold voltage and then reaches the logic inversion voltage. It is, therefore, possible to obtain the desired circuit characteristics while lowering the level of the through-type current.

Figure 2:
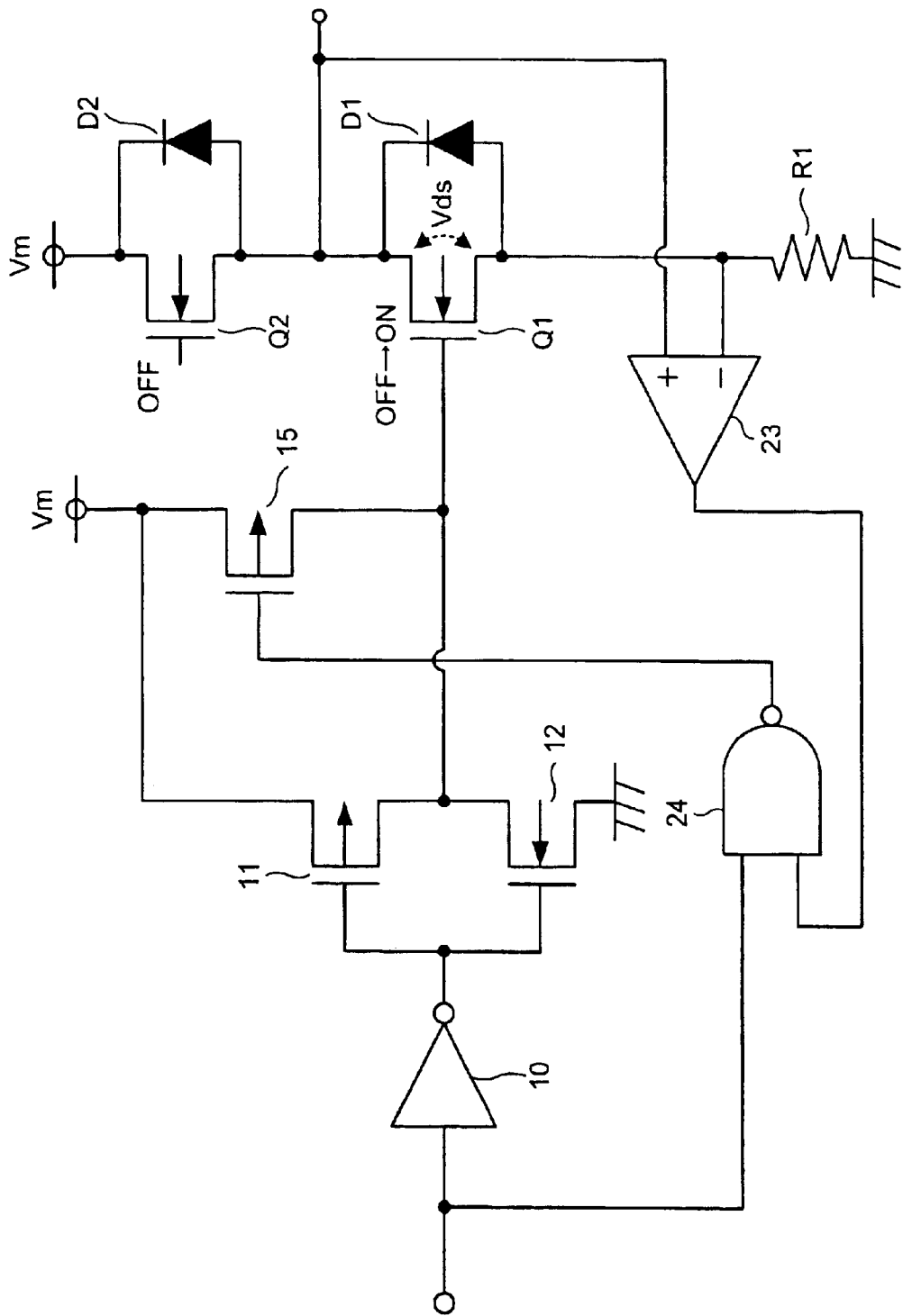
FIG. 2 is a circuit diagram of an output circuit in an inverter device according to a second embodiment of the present invention.

FIG. 2 is a circuit diagram of the output circuit according to a second embodiment of the present invention. In the output circuit shown in FIG. 2, the same or equivalent constituent elements as those shown in FIG. 1 are denoted by the same reference symbols, respectively. The sections related to the second embodiment will be mainly explained herein.

The output circuit of the inverter device in the second embodiment differs in configuration from that shown in FIG. 1 in that a comparator 23 and a NAND circuit 24 that constitute the detection circuit are provided in place of the EXCLUSIVE-OR circuit 13 and the NAND circuit 14 that constitute the detection circuit, respectively.

The drain electrode of the NMOS transistor Q1 is connected to the positive-phase input terminal (+) of the comparator 23, the connection end between the source electrode of the NMOS transistor Q1 and the external resistor R1 is connected to the negative-phase input terminal (−) of the comparator 23, and the output terminal of the comparator 23 is connected to one of the input terminals of the NAND circuit 24. The input terminal of the inverter circuit 10 is connected to the other input terminal of the NAND circuit 24, and the gate electrode of the PMOS transistor 15 is connected to the output terminal of the NAND circuit 24.

The output circuit according to the second embodiment operates as follows. If an L level signal is applied to the inverter circuit 10, the PMOS transistor 11 is turned off and the NMOS transistor 12 is turned on. As a result, the gate electrode of the NMOS transistor Q1 is connected to the ground through the NMOS transistor 12, and the NMOS transistor Q1 is turned off.

If an H level signal is then applied to the inverter circuit 10, the PMOS transistor 11 is turned on and the NMOS transistor 12 is turned off. As a result, the gate electrode of the NMOS transistor Q1 is connected to the power supply Vm through the NMOS transistor 11, and the charging of the miller capacitance Cgd starts.

Charging time for the miller capacitance Cgd relies on the ON resistance of the PMOS transistor 11. If the ON resistance is high, the charging time is long and the switching speed of the NMOS transistor Q1 decreases. That is, the gate voltage of the NMOS transistor Q1 gradually rises according to a charge progress status, and reaches the threshold voltage Vth at which the NMOS transistor Q1 is turned ON. In the example of FIG. 4, (4), this means that the time required before the time T1 is lengthened. During this time, the NMOS transistor Q1 gradually becomes conducting. In the initial period in which the NMOS transistor Q1 moves to this conductive state, a through-type current caused by the backward recovery current of the fly-wheel diode D2 of the upper arm is carried to the transistor Q1. However, the level of the through-type current is lowered.

Even if the gate voltage of the NMOS transistor Q1 exceeds the threshold voltage Vth, the output of the comparator 23 is kept at L level and that of the NAND circuit 24 is kept at H level until the drain-source voltage Vds lowers to not more than a certain voltage. Therefore, the PMOS transistor 15 is kept to be turned off. Accordingly, the operation for lowering the level of the through-type current is continued.

If the drain-source voltage Vds of the NMOS transistor Q1 lowers to be not more than the certain voltage, then the output of the comparator 23 is set at H level. As a result, the output of the NAND circuit 24 is set at L level, the PMOS transistor 15 is turned on, and the gate electrode of the NMOS transistor Q1 is connected to the power supply Vm.

Consequently, the charging of the miller capacitance Cgd is carried out from both the PMOS transistors 11 and 15 and accelerated, accordingly, the switching speed of the NMOS transistor Q1 is increased. Thereafter, the NMOS transistor Q1 is kept to be turned on so that the drain-source voltage Vds becomes 0V by the time the H-level signal applied to the inverter circuit 10 falls to L level. In the example of FIG. 4, (4), this corresponds to an instance in which the interval (II) is extremely short and the interval (III) is eliminated.

In the output circuit according to the second embodiment, in the same manner as the first embodiment, the switching speed of the NMOS transistor Q1 can be freely changed by setting the ON resistances of the PMOS transistors 11 and 15 according to purpose in light of the miller capacitance Cgd.

As explained above, according to the second embodiment, if the NMOS transistor of the lower arm is driven to be turned on, the switching speed of the NMOS transistor can be controlled to be low while the gate voltage thereof reaches the threshold voltage, and to be high after the drain-source voltage thereof becomes not more than the predetermined voltage. As a result, it is possible to obtain the desired circuit characteristics while lowering the level of the through-type current.

In the first and second embodiments, the examples of employing the double-diffused DMOS transistors in which the fly-wheel diodes are built as the switching elements have been explained. However, the present invention is not limited to employing such double-diffused DMOS transistors. Bipolar transistors or insulated-gate bipolar transistor (IGBT) can be similarly employed as the switching elements. When the bipolar transistors or IGBTs are employed, the fly-wheel diodes are provided externally.

In the first and second embodiments, the examples of applying the present invention to the driving circuit for the three-phase motor have been explained. However, the present invention is not limited to this case. Needless to say, the present invention is also applicable to an arbitrary inductance load.

As explained so far, according to one aspect of the present invention, the ON/OFF operations of the two switching elements connected to each other are switched over. If the control signal for turning on the switching element of the lower arm is applied, the switching element of the lower arm is first controlled so that the switching speed thereof decreases. In the initial period in which the switching element of the lower arm moves to a conductive state, the through-type current caused by the backward recovery current of the fly-wheel diode connected to the switching element of the upper arm is carried to the switching element of the lower arm. However, the level of the through-type current is lowered. This state continues before a timing at which the voltage of the control electrode of the switching element of the lower arm exceeds the logic inversion voltage, or a timing at which the potential difference between the both signal electrodes of the switching element of the lower arm lowers to not more than the predetermined voltage. If the voltage of the control electrode of the switching element of the lower arm exceeds the logic inversion voltage or the potential difference between the both signal electrodes of the switching element of the lower arm lowers to not more than the predetermined voltage, then the switching element of the lower arm is controlled so that the switching speed thereof increases. It is, therefore, possible to satisfy requirements for the desired circuit characteristics.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An inverter device comprising:
   a direct-current power supply having a positive electrode terminal and a negative electrode terminal;
   a first set of switching elements, including a plurality of switching elements connected in parallel;
   a second set of switching elements, including a plurality of switching elements connected in parallel, wherein each of the switching elements of the first set is connected in series with a corresponding one of the switching elements of the second set to form a pair of switching elements including a first switching element and a second switching element, between the positive electrode terminal and the negative electrode terminal of the direct-current power supply;
   a plurality of fly-wheel diodes, a respective fly-wheel diode being connected to each of the first switching element and the second switching element, wherein the first switching element and the second switching element are turned on and off alternately, while changing time ratio, and a signal output at a node between the first switching element and the second switching element is supplied to an inductive load;
   a first transistor that receives a control signal for turning on the first switching element, applies a power supply voltage to a control electrode of the first switching element, and starts charging of a miller capacitance of the first switching element;
   a detection circuit that detects timing at which voltage of the control electrode of the first switching element reaches a logic inversion voltage, while the control signal for tuning on the first switching element is being received, and outputs a detection signal indicating the timing; and
   a second transistor that receives the detection signal, applies the power supply voltage to the control electrode of the first switching element, and accelerates charging of the miller capacitance.

2. The inverter device according to claim 1, wherein
   the first switching element and the second switching element are negative metal-oxide semiconductor field-effect transistors, respectively,
   the first transistor and the second transistor are positive metal-oxide semiconductor transistors, respectively, and
   the detection circuit includes an EXCLUSIVE-OR circuit and a NAND circuit.

3. The inverter device according to claim 1, including three of the first and second switching elements and wherein the inductive load is a three-phase motor.

4. The inverter device according to claim 1, further comprising a third transistor connected between the first transistor and ground.

5. The inverter device according to claim 4, further comprising an inverter circuit that receives the control signal and supplies the control signal to the first transistor, the detection circuit, and the third transistor.

6. An inverter device comprising:
   a direct-current power supply having a positive electrode terminal and a negative electrode terminal;
   a first set of switching elements, including a plurality of switching elements connected in parallel;
   a second set of switching elements, including a plurality of switching elements connected in parallel, wherein each of the switching elements of the first set is connected in series with a corresponding one of the switching elements of the second set to form a pair of switching elements including a first switching element and a second switching element, between the positive electrode terminal and the negative electrode terminal of the direct-current power supply;
   a plurality of fly-wheel diodes, a respective fly-wheel diode being connected to each of the first switching element and the second switching element, wherein the first switching element and the second switching element are turned on and off alternately, while changing time ratio, and a signal output at a node between the first switching element and the second switching element is supplied to an inductive load;
   a first transistor that receives a control signal for turning on the first switching element, applies a power supply voltage to a control electrode of the first switching element, and starts charging of a miller capacitance of the first switching element;
   a detection circuit that detects timing at which potential difference between both signal electrodes of the first switching element reaches a logic inversion voltage, while the control signal for turning on the first switching element is being received, and outputs a detection signal indicating the timing; and
   a second transistor that receives the detection signal, applies the power supply voltage to the control electrode of the first switching element, and accelerates charging of the miller capacitance.

7. The inverter device according to claim 6, wherein
   the first switching element and the second switching element are negative metal-oxide semiconductor field-effect transistors, respectively,
   the first transistor and the second transistor are positive metal-oxide semiconductor transistors, respectively, and
   the detection circuit includes a comparator circuit and a NAND circuit.

8. The inverter device according to claim 6, including three of the first and second switching elements, and wherein the inductive load is a three-phase motor.

9. The inverter device according to claim 6, further comprising a third transistor connected between the first transistor and ground.

10. The inverter device according to claim 9, further comprising an inverter circuit that receives the control signal and supplies the control signal to the first transistor, the detection circuit, and the third transistor.

* * * * *